United States Patent
Trivedi et al.

(10) Patent No.: US 7,332,388 B2
(45) Date of Patent: Feb. 19, 2008

(54) METHOD TO SIMULTANEOUSLY FORM BOTH FULLY SILICIDED AND PARTIALLY SILICIDED DUAL WORK FUNCTION TRANSISTOR GATES DURING THE MANUFACTURE OF A SEMICONDUCTOR DEVICE, SEMICONDUCTOR DEVICES, AND SYSTEMS INCLUDING SAME

(75) Inventors: Jigish D. Trivedi, Boise, ID (US); Suraj Mathew, Boise, ID (US)

(73) Assignee: Micron Technology, Inc., Boise, ID (US)

(*) Notice: Subject to any disclaimer, the term of this patent is extended or adjusted under 35 U.S.C. 154(b) by 132 days.

(21) Appl. No.: 11/076,497

(22) Filed: Mar. 8, 2005

(65) Prior Publication Data

US 2006/0205133 A1  Sep. 14, 2006

(51) Int. Cl.
H01L 21/8238 (2006.01)

(52) U.S. Cl. ............ 438/199; 438/275; 438/592; 257/369; 257/E21.002

(58) Field of Classification Search ............... 438/199, 438/275, 592; 257/369, 388, 407, 413
See application file for complete search history.

(56) References Cited

U.S. PATENT DOCUMENTS

| | | | |
|---|---|---|---|
| 5,567,638 A | 10/1996 | Lin et al. .................... 438/592 |
| 5,861,340 A * | 1/1999 | Bai et al. ................... 438/592 |
| 6,027,961 A | 2/2000 | Maiti et al. ................ 438/199 |
| 6,214,656 B1 | 4/2001 | Liaw ......................... 438/199 |
| 6,373,114 B1 * | 4/2002 | Jeng et al. ................. 257/413 |
| 6,410,376 B1 | 6/2002 | Ng et al. .................... 438/199 |
| 6,440,799 B1 | 8/2002 | Trivedi ...................... 438/268 |
| 6,458,679 B1 * | 10/2002 | Paton et al. ................ 438/592 |
| 6,573,169 B2 * | 6/2003 | Noble et al. ............... 438/592 |
| 6,624,019 B2 | 9/2003 | Kim .......................... 438/241 |
| 6,645,818 B1 | 11/2003 | Sing et al. .................. 438/275 |
| 6,670,681 B2 | 12/2003 | Trivedi ...................... 257/369 |
| 6,730,587 B1 * | 5/2004 | Bertrand et al. ............ 438/592 |
| 6,750,519 B2 | 6/2004 | Lin et al. .................... 257/407 |
| 6,794,281 B2 | 9/2004 | Madhukar et al. .......... 438/592 |
| 6,797,596 B2 | 9/2004 | Ahmed et al. .............. 438/524 |
| 6,809,014 B2 | 10/2004 | Mathew et al. ............ 438/514 |
| 6,835,639 B2 | 12/2004 | Rotondaro et al. ......... 438/592 |
| 6,844,591 B1 | 1/2005 | Tran ........................... 257/330 |
| 6,929,992 B1 * | 8/2005 | Djomehri et al. ........... 438/199 |
| 6,956,263 B1 * | 10/2005 | Mistry ........................ 257/330 |
| 2002/0096724 A1 | 7/2002 | Liang et al. ................. 257/369 |
| 2004/0023478 A1 | 2/2004 | Samavedam et al. ....... 438/592 |
| 2004/0256679 A1 | 12/2004 | Hu ............................. 257/371 |
| 2006/0199324 A1 * | 9/2006 | Yu et al. ..................... 438/199 |

\* cited by examiner

*Primary Examiner*—Zandra V. Smith
*Assistant Examiner*—Christy L Novacek

(57) ABSTRACT

A method for forming transistor gates having two different work functions comprises forming a first polysilicon layer which may be doped with n-type dopants. The first polysilicon layer comprises an inhibitor material at select locations which retards silicide formation. A second polysilicon layer is formed over the first polysilicon layer. The first and second polysilicon layers are masked and etched to define transistor structures, some of which comprise the inhibitor and some which are free from the inhibitor. Dielectric spacers are formed, then a metal such as cobalt is deposited over the transistor structures. A thermal process may be used to react the metal with the transistor structures to form fully silicided gates from the inhibitor-free structures and partially silicided gates from the structures comprising the inhibitor. Fully silicided gates have the work function of a metal gate while partially silicided gates may have the work function of doped polysilicon.

19 Claims, 6 Drawing Sheets

METHOD TO SIMULTANEOUSLY FORM BOTH FULLY SILICIDED AND PARTIALLY SILICIDED DUAL WORK FUNCTION TRANSISTOR GATES DURING THE MANUFACTURE OF A SEMICONDUCTOR DEVICE, SEMICONDUCTOR DEVICES, AND SYSTEMS INCLUDING SAME

FIELD OF THE INVENTION

This invention relates to the field of semiconductor manufacture and, more particularly, to methods for forming complementary metal oxide semiconductor (MOS) transistors having dual work function transistor gate electrodes during a single silicidation process.

BACKGROUND OF THE INVENTION

Complementary metal oxide semiconductor (CMOS) devices are dominated by n-channel (NMOS) and p-channel (PMOS) transistor structures. Various physical characteristics of each type of transistor determine the threshold voltage ($V_t$) which must be overcome to invert the channel region and to cause a given transistor to conduct majority carriers (either by electron movement in an NMOS device or by hole movement in a PMOS device).

One of the controlling physical characteristics of a transistor is the work function of the material used to form the gate electrode of the transistor device. In semiconductor devices such as dynamic random access memory (DRAM) devices, transistor gates are predominantly polysilicon and an overlying layer of metal silicide. However, polysilicon transistor gates are prone to polysilicon depletion effects such as unwanted voltage drops which reduce transistor performance.

A second problem prone to boron-doped polysilicon gate is boron penetration. Boron penetration results from migration of p-type dopants from a polysilicon gate of a p-channel transistor through the gate oxide region into the transistor channel. A common remedy is to incorporate nitrogen into the gate oxide. While nitrogen decreases boron penetration in p-channel transistors, it has undesirable effects on n-channel transistors such as decreased carrier mobility. However, the benefit/cost effects of global nitrogen incorporation generally outweigh the adverse effects, and thus nitrogen incorporation is performed globally.

Metal gate technology presents an alternate approach for CMOS transistor devices, as the traditional polysilicon gate electrodes are replaced with metal or metal alloy electrodes. To substitute the traditional p-type or n-type polysilicon transistor gate with a metal or metal compound, it is desirable to use metals which have similar work function characteristics of p-type or n-type polysilicon to obtain a comparable transistor threshold voltage. N-type doped silicon has a work function of approximately 4.15 electron volts (eV). Metals having a similar work function include aluminum, manganese, zirconium, niobium, hafnium, and tantalum. P-type doped silicon has a work function of approximately 5.2 eV. Metals having a similar work function include nickel, cobalt, platinum, and ruthenium. A method and structure for CMOS transistor gates of metal are described in US Patent Application Publication 2004/0256679 by Yongjun J. Hu, assigned to Micron Technology, Inc. and incorporated herein by reference as if set for in its entirety.

The manufacturability of CMOS using dual metal to engineer the work function is not trivial and leads to myriad complexities in the integration. A simpler alternative would be to have a dual work function scheme which is compatible with the current CMOS flow, where fully silicided gates offer work functions conducive to p-channel devices independent of polysilicon doping, while partially silicided gates provide work functions appropriate for n-channel devices if they are n-doped. A method for forming a CMOS device using a method compatible with present processing methods for forming both p-channel and n-channel devices, with one of the devices having a fully silicided word line with a first work function and the other of the devices having a partially silicided polysilicon word line with a second work function different from the first work function, would be desirable.

SUMMARY OF THE INVENTION

The present invention provides a method which simultaneously forms n-channel and p-channel transistor gates, wherein one gate is fully silicided and the other is partially silicided and partially formed from polysilicon. The resulting gates, which are also described, comprise two different work functions.

In accordance with one embodiment of the invention, a first polysilicon layer is formed which is masked with a first mask in a first location. At a second, unmasked location, a concentration of nitrogen is introduced into polysilicon layer. The mask is removed, other processing is performed, then a second mask is formed to define two transistor gate structures, with a first transistor gate structure being patterned at the first location and a second transistor gate structure being patterned at the second location. The second mask is removed and dielectric spacers are formed along sidewalls of the first and second transistor gate structures. A metal layer is deposited over the second polysilicon layer, and an anneal is performed to react the metal with the polysilicon. The two polysilicon layers of the first transistor gate structure react more completely with the metal layer to form a more completely silicided transistor gate than the second transistor gate structure, due to the second transistor gate structure having the nitrogen implant. The implant of nitrogen slows or stops silicidation of the second transistor gate structure once the second polysilicon layer reacts with the metal layer.

In accordance with another embodiment, a trench or recess is etched into a semiconductor wafer, then a process similar to the embodiment of the previous paragraph is performed. This embodiment results in recessed access device (RAD) transistors having at least two transistor gates which are silicided at the same time but which have different amounts of silicidation and different work functions.

In accordance with another embodiment, a semiconductor device comprises a first transistor gate, wherein a conductive portion of the first transistor gate consists essentially of a metal silicide layer, and a second transistor gate, wherein a conductive portion of the second transistor gate comprises a metal silicide layer, a polysilicon layer, and a silicide inhibitor. The metal silicide layer of the first transistor gate and the metal silicide layer of the second transistor gate are first and second portions respectively of a single metal silicide layer.

In another embodiment, a semiconductor device such as a memory device, a logic device, or a microprocessor comprises a transistor structure of the previous paragraph.

In another embodiment, an electronic system, for example a system related to computing, telecommunications, the automobile industry, semiconductor test and manufacturing equipment, consumer electronics, etc. comprises a semiconductor device as described in the previous paragraph.

Additional advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE ILLUSTRATED EMBODIMENTS

The term "wafer" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" in the following description, previous process steps may have been utilized to form regions or junctions in or over the base semiconductor structure or foundation. Additionally, when reference is made to a "substrate assembly" in the following description, the substrate assembly may include a wafer with layers including dielectrics and conductors, and features such as transistors, formed thereover, depending on the particular stage of processing. In addition, the semiconductor need not be silicon-based, but could be based on silicon-germanium, silicon-on-insulator, silicon-on-sapphire, germanium, or gallium arsenide, among others. Further, in the discussion and claims herein, the term "on" used with respect to two layers, one "on" the other, means at least some contact between the layers, while "over" means the layers are in close proximity, but possibly with one or more additional intervening layers such that contact is possible but not required. Neither "on" nor "over" implies any directionality as used herein.

A first embodiment of an inventive method to form transistor gates is depicted in FIGS. 1-8. The FIGS. and description below depict and recite the formation of a partially silicided n-channel device on the right side of the FIGS. and a fully silicided p-channel device on the left side of the FIGS., although the process may be altered. For example, a fully silicided n-channel device may be formed to engineer the work function of the n-channel device to result in an n-channel device with a high threshold voltage. Further, a device having n-channel and p-channel transistor gates which are both partially silicided may be formed to rely on polysilicon doping to set the work functions. In the case of partially silicided p-channel and n-channel devices, the silicidation is used as a technique to lower the gate resistance. The degree of silicidation, however, is determined by an amount of nitrogen in the polysilicon rather than by the amount of metal available and by the anneal conditions.

Figure 1:
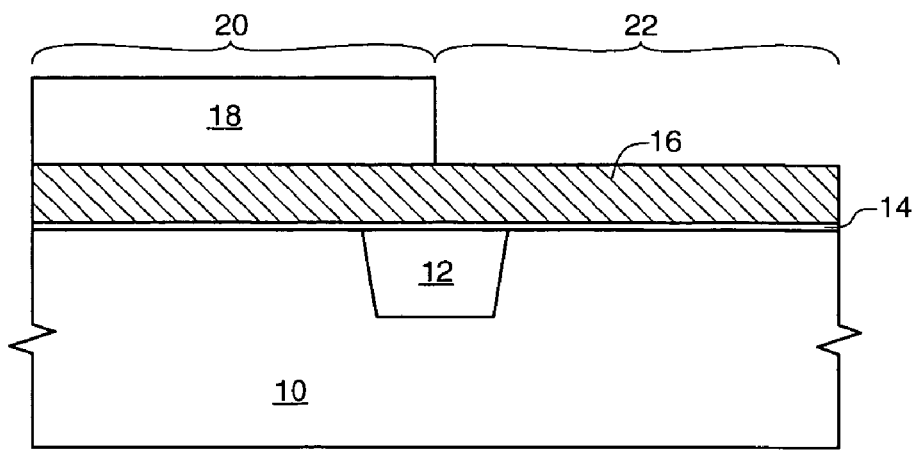
FIGS. 1-8 are cross sections depicting in-process structures formed during implementation of an embodiment of the method of the present invention.

FIG. 1 depicts a semiconductor wafer 10 having a region of shallow trench isolation (STI, field oxide) 12 formed therein, and a gate dielectric (gate oxide) 14 formed thereon. A first polysilicon layer 16 may be formed according to means known in the art to be between about 200 angstroms (Å) and about 2,000 Å thick. At this point in the process, polysilicon layer 16 is undoped or it may be lightly doped, depending on the eventual use of the invention, as long as it does not interfere with the present process. Further, other structures may be present in the FIG. 1 structure which are not depicted or described as they are not immediately germane to the present invention.

Next, first mask layer 18, for example a first layer of photoresist (resist), is formed to cover a first region 20 of polysilicon layer 16 where a first transistor gate will be formed. Resist layer 18 leaves a second region 22 of polysilicon 16 uncovered where a second transistor gate will be formed.

Figure 2:
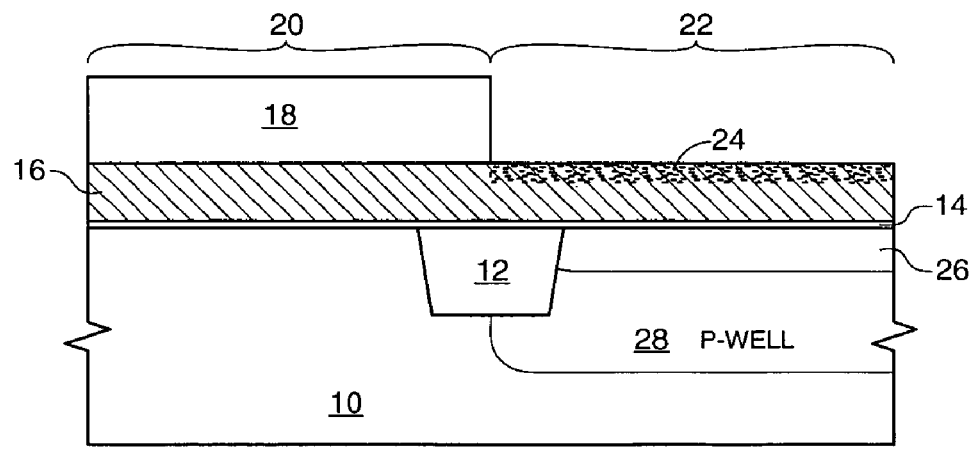

After forming the FIG. 1 structure, a concentration of nitrogen 24 is introduced within region 22 of polysilicon 16 as depicted in FIG. 2. The nitrogen may be implanted to a concentration of between about 1e14 atoms/cm$^2$ and about 1e16 atoms/cm$^2$. The nitrogen incorporation may be targeted to a depth of between about 30% to about 50% of the thickness of polysilicon layer 16. For the layer described herein having a thickness of between about 200 Å and about 2,000 Å, the target depth is between about 100 Å and about 700 Å.

During subsequent processing, the nitrogen implant will function as an inhibitor to retard the formation of silicide from the polysilicon layer and a metal layer during subsequent processing. Depending on the nitrogen concentration, the inhibitor will slow or stop the formation of silicide.

An alternative to implanting nitrogen is to form a plasma nitridation layer over polysilicon 16 to incorporate an equivalent amount of nitrogen in the polysilicon 16 at the surface. Plasma nitridation is not typically formed in the presence of a photoresist layer such as layer 18, however recent technology advances have indicated that the formation of a nitridation layer in the presence of photoresist may be possible. Plasma nitridation may be especially advantageous with a thin first polysilicon layer as may be required by scaling requirements.

While the embodiment described herein uses a nitrogen implant, plasma nitridation, or any other technique to incorporate nitrogen to inhibit the silicidation rate of the polysilicon layer 16, it will be noted that other silicidation reduction layers, such as a discrete layer formed on polysilicon layer 16, are possible which are encompassed by the present invention. Several other species such as hydrogen, carbon, and argon would function sufficiently to retard or inhibit the silicidation rate of the polysilicon. The silicidation inhibitor used should slow or stop the silicidation of polysilicon layer 16 without unduly increasing the vertical resistance of the completed transistor gate, and without providing contaminants which would negatively affect device performance.

Either before or after this nitrogen implant, an n-channel enhancement implant 26 and a p-well implant 28 may be performed according to techniques known in the art to form the FIG. 2 structure. After forming the FIG. 2 structure the first patterned mask 18 is removed.

Figure 3:
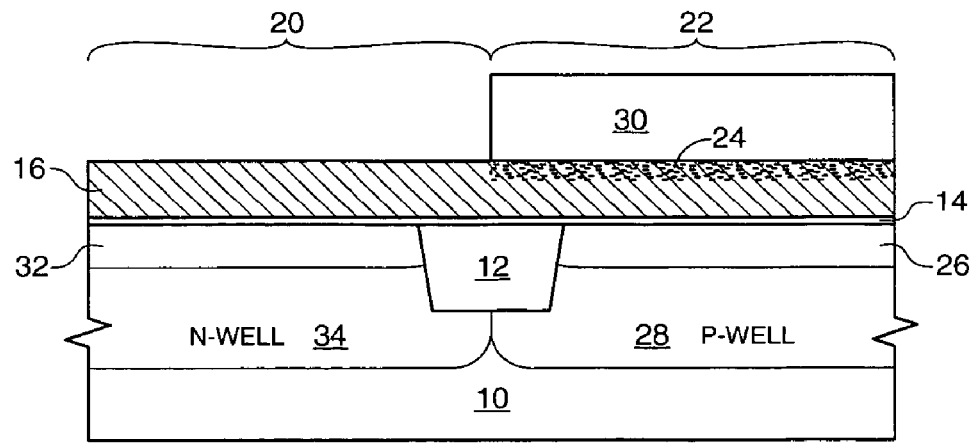

Subsequently, a second mask 30 is formed over region 22 and which leaves region 20 unexposed as depicted in FIG. 3. A p-channel enhancement implant 32 and an n-well implant 34 are performed according to techniques known in the art to result in the structure of FIG. 3.

Figure 4:
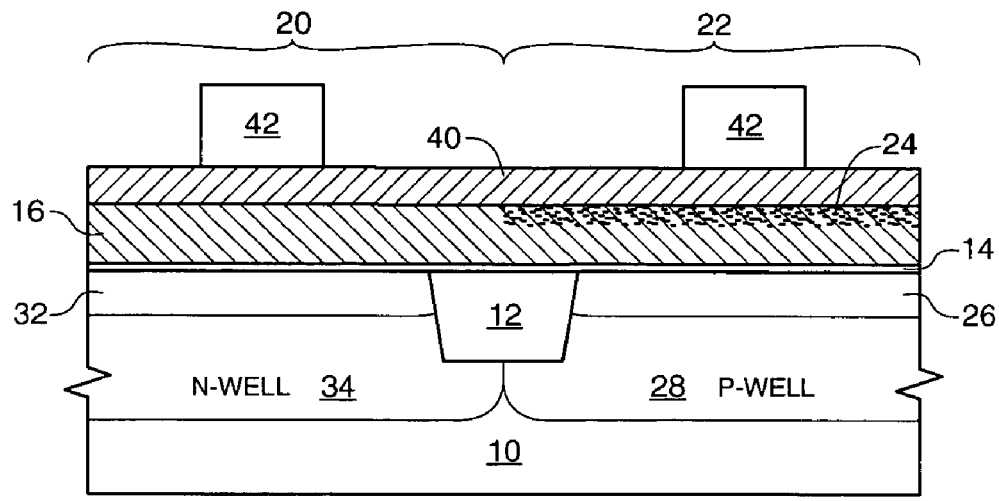

After forming the FIG. 3 structure the second resist mask 30 is removed and a second polysilicon layer 40 is formed to between about 300 Å and about 1,000 Å thick as depicted in FIG. 4. A third patterned photoresist mask 42 is formed over polysilicon layer 40 which will define a p-channel transistor gate structure at region 20 and an n-channel transistor gate structure at region 22. After forming the FIG. 4 structure, an etch is performed to etch the second polysilicon layer 40, the first polysilicon layer 16, and to stop at (i.e. on or within) gate oxide layer 14 such that at least a portion of gate oxide layer 14 remains over the wafer 10 as is known in the art.

Figure 5:
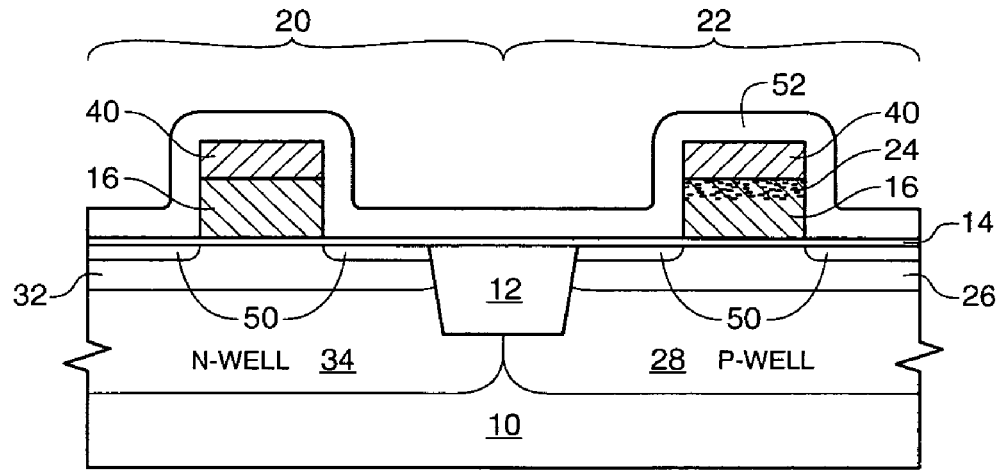

After performing the etch of the polysilicon layers 40, 16 to form the transistor gate structures, the mask 42 is removed according to techniques known in the art and a halo implant and a lightly doped drain (LDD) implant may be performed to dope the wafer 50 with an initial implant for source/drain regions 50 as depicted in FIG. 5. Next, a blanket spacer dielectric layer 52, for example oxide or nitride, is formed as depicted in FIG. 5.

Figure 6:
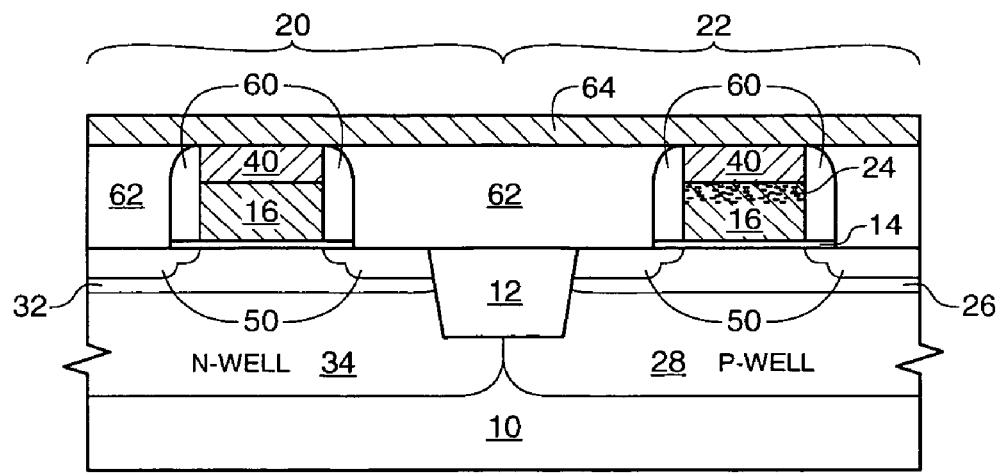

After forming blanket spacer layer 52, an anisotropic spacer etch is performed to form spacers 60 as depicted in FIG. 6 along sidewalls of the transistor gate structures. This etch also removes any gate oxide overlying wafer 10 which is not under the transistor gate structures or spacers. Next, a second source/drain implant into the wafer is performed to complete the source/drain regions 50. A layer of dielectric 62 such as borophosphosilicate glass (BPSG) or tetraethyl orthosilicate (TEOS) is formed over the wafer. If necessary, dielectric layer 62 is planarized so that the upper level of oxide 62 is even with the upper level of the second polysilicon layer 40 as depicted. Process margin may be included so that some etching of polysilicon layer 40 will not adversely affect the process.

After completing dielectric layer 62, a conductive layer 64, such as a refractory metal layer, is formed over the wafer surface to complete the structure of FIG. 6. Layer 64 is a material which will react with polysilicon layer 40 upon the application of a catalyst, such as heat during an anneal process. A refractory metal (a metal with a boiling point of at least 4,000° C.) such as cobalt would function sufficiently, although other metals such as nickel, titanium, molybdenum or other conductive layers may be sufficient depending on the eventual use of the completed structure.

After forming the FIG. 6 structure, the catalyst necessary to react the conductive layer 64 with polysilicon is applied. In the present embodiment, the FIG. 6 structure is annealed in a nitrogen atmosphere at a chamber temperature of between about 400° C. and about 700° C. for between about 30 seconds and about 5 minutes.

Figure 7:
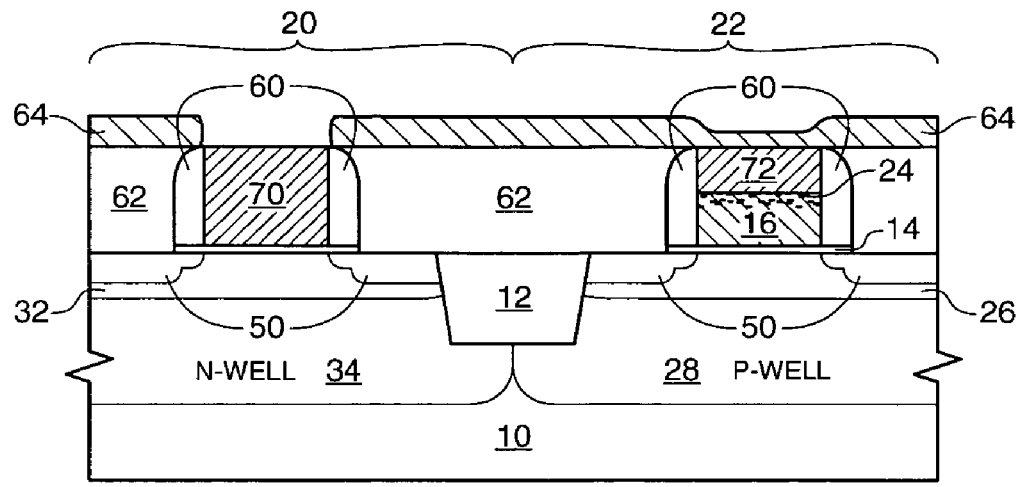

The transistor gate structure at region 22 reacts differently with conductive layer 64 during the application of the catalyst than does the transistor gate structure at region 20 due to the doping of the nitrogen 24. Both of polysilicon layers 16, 40 of the transistor gate structure at region 20 preferably react completely with conductive layer 64 to form a fully silicided transistor gate 70 as depicted in FIG. 7. Polysilicon layer 40 of the transistor gate structure at region 22 also preferably reacts entirely with conductive layer 64 to form silicide 72. However, the nitrogen dopant 24 within layer 16 of the transistor gate structure of region 22 slows or eliminates the reaction of layer 16 with the conductive layer 64, and thus only slightly reacts or does not react at all with the conductive layer 64. Thus most or all of layer 16 of the transistor gate structure of region 22 remains unreacted polysilicon within the completed transistor gate.

FIG. 7 depicts the conductive layer 64 which overlies the transistor gate at region 20 as being depleted of material, while a portion of layer 64 remains over the completed transistor gate at region 22. In practice, conductive layer 64 will be of a sufficient thickness to ensure an adequate amount of material so that layers 16, 40 at region 20 may completely react to form a fully silicided transistor gate, for example a gate of cobalt silicide if layer 64 is cobalt.

After the application of the catalyst to react the conductive layer 64 with the polysilicon layers, the unreacted material is removed. In the case of a cobalt metal layer as conductive layer 64, this entails an etch which can remove cobalt metal selective to cobalt silicide, dielectric 62, and dielectric 60, for example using hydrochloric acid. After removal of unreacted layer 64, the structure of FIG. 8 remains. Wafer processing then continues to form a semiconductor device according to techniques known in the art.

Figure 8:
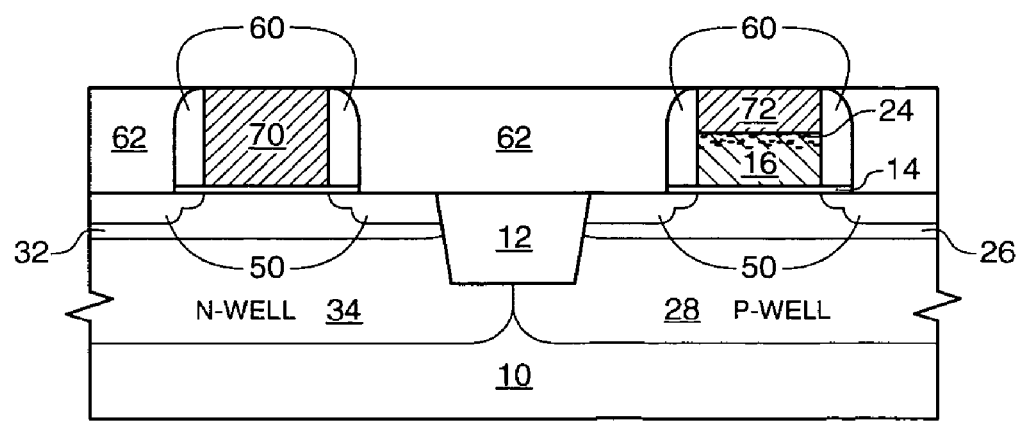

The semiconductor device of FIG. 8 thus comprises a p-channel transistor gate wherein a conductive portion of the transistor gate consists essentially of a metal silicide layer. FIG. 8 further depicts an n-channel transistor gate, wherein a conductive portion of the n-channel transistor gate comprises a metal silicide layer, a polysilicon layer, and a silicide inhibitor layer. The p-channel gate is free from the inhibitor layer. The metal silicide layer of the p-channel transistor gate and the metal silicide layer of the n-channel transistor gate are first and second portions respectively of a single metal silicide layer.

For purposes of the disclosure, the p-channel transistor gate may have a concentration of the inhibitor material which occurs from environmental sources or from processing sources not directly related to the inhibitor layer, and still be free from the inhibitor layer.

The fully silicided transistor gate is expected to have a work function of between about 4.6 electron volts (eV) and about 5.2 eV, while the partially silicided transistor gate is expected to have a work function of about 4.1 eV if it is doped with arsenic or phosphorous or of about 5.2 eV if it is doped with boron. In either case, the dopant concentration will be between about 1e15 atoms/cm$^2$ and 1e16 atoms/cm$^2$. Due to the insulative nature of undoped polysilicon, work function values greater than about 4.1 eV and less than about 5.2 eV are not practical for the partially silicided transistor gate. The work function of the partially silicided transistor gate may be optimized somewhat for a particular value by changing the proportion of silicided polysilicon to unsilicided polysilicon, by doping the silicide, or by changing the metal which reacts with the polysilicon to form the metal silicide. Optimization of the amount of silicide which is formed as a percentage of the gate thickness may be effected by changing the thickness of polysilicon layer 40 relative to polysilicon layer 16 and/or by changing the depth of the nitrogen implant into polysilicon layer 16 prior to silicidation. In general, the thickness of the silicide layer of the fully silicided transistor gate will be between about 1.5 times to about 4.0 times the thickness of the silicide thickness of the partially silicided gate.

It is not anticipated that nitrogen doping 24 will adversely affect the operation of the transistor gate, for example by increasing the vertical resistance. Further, the expansion of the gates during the silicidation process is not expected to require any process considerations, as the polysilicon layer increases in volume by only about 1% to about 3% during the silicidation process.

Another advantage of the process described above is that no barrier is required to prevent mobile boron ions from diffusing from the p-type polysilicon transistor gate into the gate oxide of the p-channel transistor. Such a barrier is typically a gate oxide with a concentration of nitrogen located under the p-channel transistor gate and is used to reduce the diffusion of p-type dopants such as boron from the polysilicon gate layer into the gate oxide on the p-channel side. Implantation of the dopants into the polysilicon are performed to adjust the conductivity of the transistor gate material to desired levels. P-dopant out diffusion from the polysilicon transistor gate results in boron penetration of the dopants and an undesirable alteration of the electrical characteristics of the transistor, such as lowering of the threshold voltage ($V_t$). Forming an oxynitride barrier layer, however, reduces the mobility of electrons across the channel region in n-channel devices, and is thus undesirable on the n-channel side, but is used for cell stability on the p-channel side. U.S. Pat. No. 6,809,014 by the present inventors, assigned to Micron Technology, Inc. and incorporated herein by reference as if set forth in its entirety, discusses a method for avoiding the oxynitride layer from interfering with the n-channel transistors.

With the present invention, no p-type doping of the polysilicon gate material on the p-channel transistor side is required, because the silicide gate provides sufficient conductivity. Thus no oxynitride barrier is required to reduce depletion on the p-channel side, which results in improved electrical performance of the n-channel transistors. Omitting this oxynitride results in an improvement of between about 5% to about 10% in the n-channel mobility (i.e. a decreased resistance to the flow of electrons across the channel region during device activation).

The transistor devices may be used in the periphery of a memory device. Further, with some process modifications, such as the with addition of a dielectric capping layer to prevent shorting with a digit line plug, transistors in accordance with the present invention may be used in a semiconductor device array.

Figure 9:
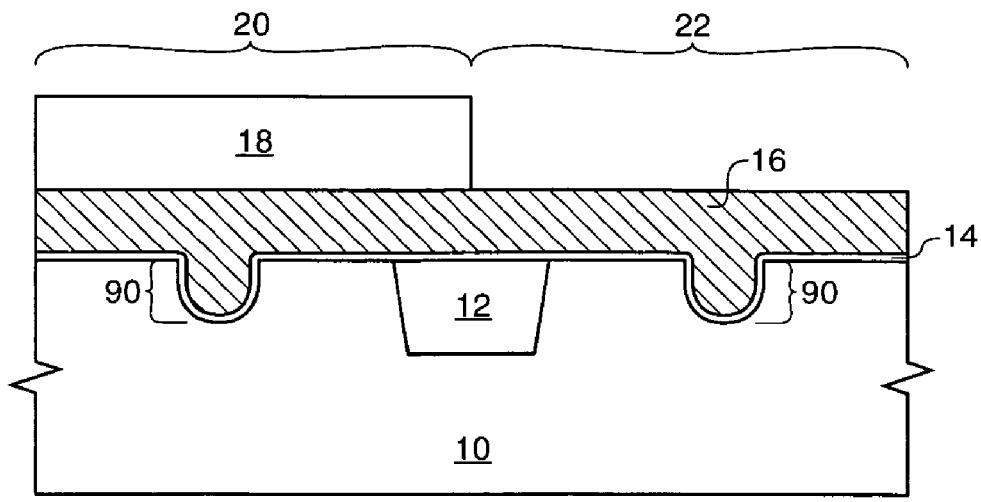
FIGS. 9 and 10 are cross sections depicting in-process structures formed during implementation of an embodiment of the method of the present invention.
Figure 10:
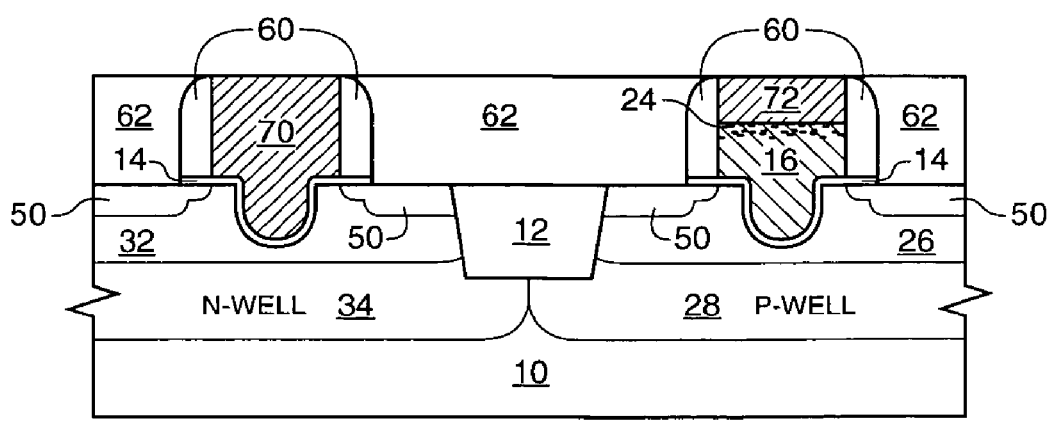

Additionally, modifications of the embodiment described above and depicted in FIGS. 1-8 may be made to form other types of devices. For example, FIGS. 9 and 10 depict structures which are analogous to the structures of FIGS. 1 and 8 respectively, except that a device type known as a "recessed access device" (RAD device) is depicted. The RAD device may be formed using a similar process flow to the flow depicted in FIGS. 1-8.

In the FIG. 9 structure, the silicon wafer 10 has been etched subsequent to forming STI 12. Further, the polysilicon 16 has been planarized prior to forming resist 18 to provide a horizontal upper surface of polysilicon layer 16. The etch of the silicon wafer, which may be performed by one of ordinary skill in the art, provides a plurality of recesses or elongate trenches 90 in the wafer, two of which are depicted. The process continues according to the description of FIGS. 1-8 to form the structure of FIG. 10 having a fully silicided transistor gate 70 and a partially silicided transistor gate having a first silicided portion 72 and a partially silicided or unsilicided portion 16 depending on the nitrogen concentration 24 which was provided within polysilicon layer 16.

As discussed above, the fully silicided transistor gate 70 of a device comprising the FIG. 10 structure, depending on the dimensions of the device, is expected to have a work function of between about 4.6 electron volts (eV) and about 5.2 eV, while the partially silicided transistor gate 16, 72 is expected to have a work function of about 4.1 eV when doped with arsenic or phosphorous or of about 5.2 eV when doped with boron. As with the device comprising the structure of FIG. 8, the work function of the partially silicided transistor gate may be optimized for a particular value by changing the proportion of silicided polysilicon to unsilicided polysilicon. This may be effected by changing the thickness of the second layer of polysilicon relative to polysilicon layer 16 and/or by changing the depth of the nitrogen implant into polysilicon layer 16 prior to silicidation. The type of dopants and their concentration also affects work function.

Figure 11:
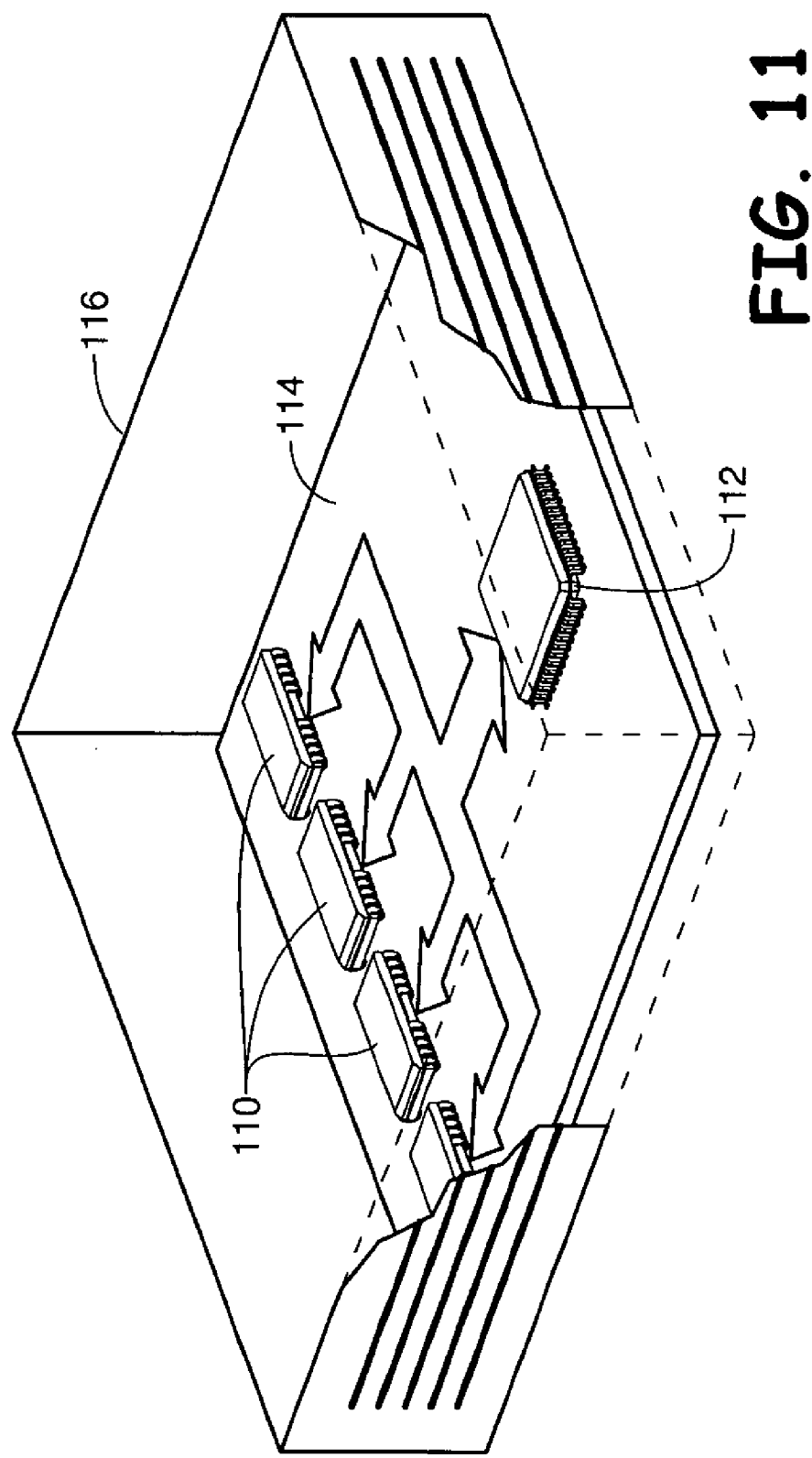
FIG. 11 is an isometric depiction of various components of an electronic system which may be manufactured using devices formed with an embodiment of the present invention.

As depicted in FIG. 11, one or more semiconductor devices 110 formed in accordance with the invention may be attached along with other such devices such as a microprocessor 112 to a printed circuit board 114, for example to a computer motherboard or as a part of a memory module used in a personal computer, a minicomputer, or a mainframe 116. FIG. 11 may also represent use of device 110 in other electronic devices comprising a housing 116, for example devices comprising a microprocessor 112, related to telecommunications, the automobile industry, semiconductor test and manufacturing equipment, consumer electronics, or virtually any piece of consumer or industrial electronic equipment.

Figure 12:
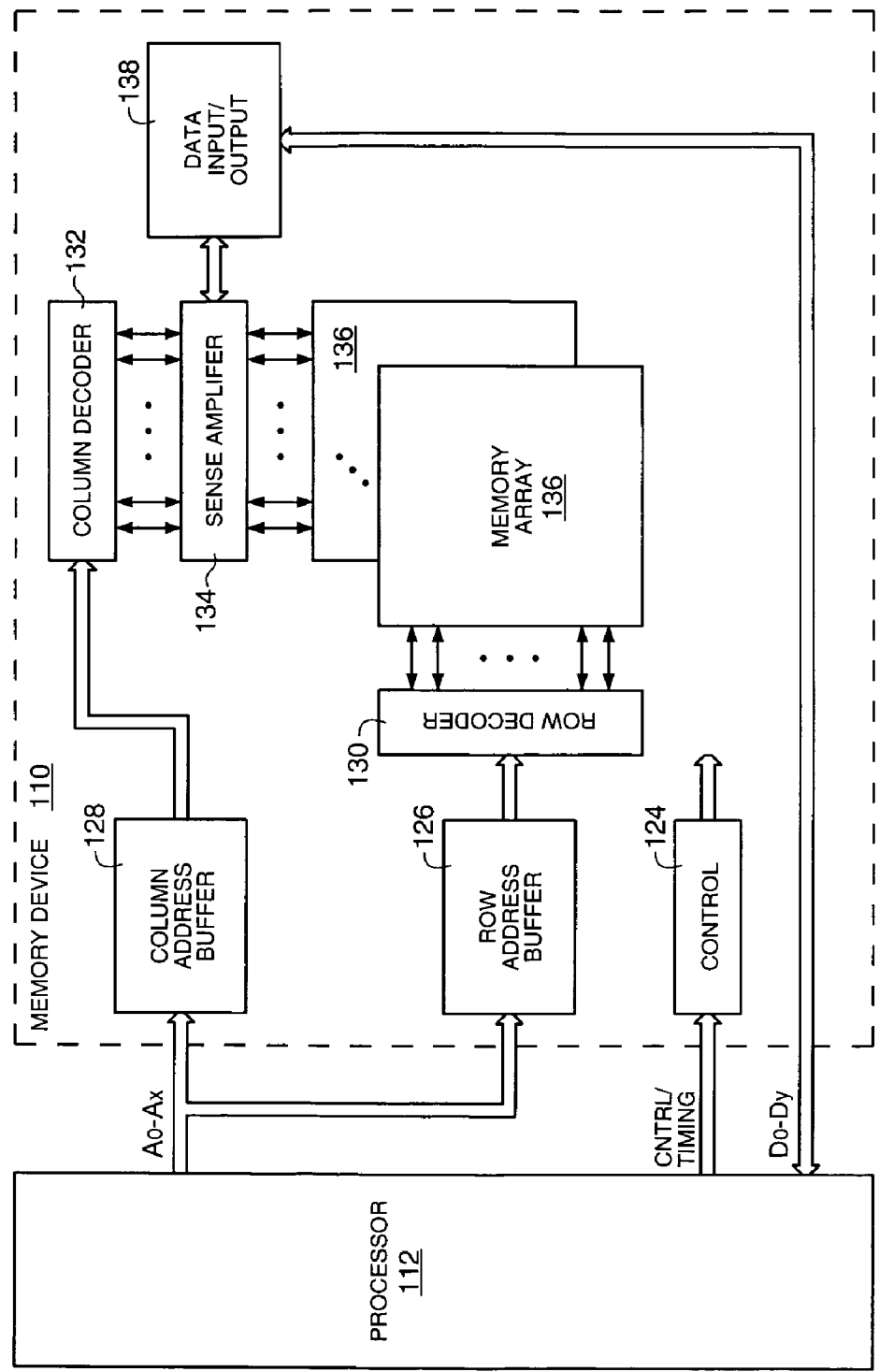
FIG. 12 is a block diagram of an exemplary use of the invention to form part of a memory device having a storage transistor array such as may be used in an electronic system as depicted.

The process and structure described herein can be used to manufacture a number of different structures comprising at least two transistors. FIG. 12, for example, is a simplified block diagram of a memory device such as a dynamic random access memory having transistors of the present invention. The general operation of such a device is known to one skilled in the art. FIG. 12 depicts a processor 112 coupled to a memory device 110, and further depicts the following basic sections of a memory integrated circuit: control circuitry 124; row 126 and column 128 address buffers; row 130 and column 132 decoders; sense amplifiers 134; memory array 136; and data input/output 138.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A method for use in fabrication of a semiconductor device, the method comprising:

forming a first polysilicon layer over a semiconductor wafer;

forming a silicidation inhibitor at a first location which comprises the first polysilicon layer to reduce a silicidation rate of the first polysilicon at the first location, leaving a second location which comprises the first polysilicon layer free from the silicidation inhibitor;

forming a second polysilicon layer over the first polysilicon layer and over the silicidation inhibitor;

etching the first and second polysilicon layers at the first location to define a first transistor gate structure;

etching the first and second polysilicon layers at the second location to define a second transistor structure;

forming a metal layer in contact with the first transistor structure and the second transistor structure; and simultaneously converting the second polysilicon layer at the first location and both the first and second polysilicon layers at the second location to silicide, wherein at least a portion of the first polysilicon layer at the first location remains unsilicided.

2. The method of claim 1 further comprising forming the silicidation inhibitor by implanting the first polysilicon layer at the first location with a material selected from the group consisting of hydrogen, carbon, and argon.

3. The method of claim 1 further comprising forming the silicidation inhibitor by implanting the first polysilicon layer at the first location with nitrogen.

4. The method of claim 3 further comprising implanting the nitrogen at the first location to a depth of between about 30% to about 50% of a thickness of the first polysilicon layer.

5. The method of claim 1 further comprising forming the silicidation inhibitor by forming a plasma nitridation layer.

6. The method of claim 1 further comprising:
simultaneously etching both the first and second polysilicon layers at both the first and second locations to define the first and second transistor gate structures;
forming dielectric spacers along first and second sidewalls of both the first and second transistor gate structures; then
performing the act of converting the second polysilicon layer at the first location and both the first and second polysilicon layers at the second location to suicide to form a first transistor gate at the first location and a second transistor gate at the second location.

7. The method of claim 6 further comprising causing the first transistor gate to have a first work function and the second transistor gate to have a second work function which is different than the first work function.

8. The method of claim 6 further comprising:
etching first and second recesses into the semiconductor wafer;
forming the first polysilicon layer at least partially within both the first and second recesses in the semiconductor wafer; and
forming the silicidation inhibitor at the first location, wherein the first location overlies the first recess in the semiconductor wafer,
wherein the second location which comprises the first polysilicon layer overlies the second recess in the semiconductor wafer.

9. A method for use in fabrication of a semiconductor device, the method comprising:
forming a first polysilicon layer over a semiconductor wafer;
implanting a first location of the first polysilicon layer with nitrogen and leaving a second location of the first polysilicon layer free from nitrogen implantation;
performing an n-channel enhancement implant into the semiconductor wafer at the first location;
performing a p-channel enhancement implant into the semiconductor wafer at the second location;
forming a second polysilicon layer over the first polysilicon layer at the first and second locations;
patterning both the first and second polysilicon layers to form an n-channel transistor gate structure at the first location and a p-channel transistor gate structure at the second location;
forming dielectric spacers along first and second sidewalls of the first transistor gate structure and along first and second sidewalls of the second transistor gate structure; and subsequent to forming the dielectric spacers, converting both the first and second polysilicon layers of the p-channel transistor gate structure to silicide to form a p-channel transistor gate and converting the second polysilicon layer of the n-channel transistor structure to silicide, and leaving the first polysilicon layer of the n-channel transistor substantially unsilicided, to form an n-channel transistor gate.

10. The method of claim 9 further comprising converting both the first and second polysilicon layers of the p-channel transistor structure to silicide and converting the second polysilicon layer of the n-channel transistor structure to silicide during a single silicidation act.

11. The method of claim 10 wherein the single silicidation act comprises annealing the p-channel transistor structure and the n-channel transistor structure at a chamber temperature of between about 400° C. and about 700° C. for between about 30 seconds and about 5 minutes.

12. The method of claim 9 further comprising doping the first polysilicon layer with an n-type dopant, wherein subsequent to converting both the first and second polysilicon layers of the p-channel transistor structure to silicide to form a p-channel transistor gate, the p-channel transistor gate has a work function of about 5.2 ev, and subsequent to converting the second polysilicon layer of the n-channel transistor structure to silicide to form an n-channel transistor gate, the n-channel transistor gate has a work function of about 4.1 eV.

13. A method for use in fabrication of a semiconductor device, comprising:
providing a semiconductor wafer;
removing a portion of the semiconductor wafer to form at least first and second elongated trenches therein;
forming a gate oxide layer over the semiconductor wafer and within the first and second elongated trenches;
forming a first polysilicon layer over a semiconductor wafer and at least partially within the elongated trenches;
forming a silicidation inhibitor at a first location which comprises the first polysilicon layer and the first elongated trench, wherein the silicidation inhibitor is a material which reduces a silicidation rate of the first polysilicon at the first location, wherein a second location which comprises the first polysilicon layer and the second elongated trench is free from the silicidation inhibitor;
forming a second polysilicon layer over the first polysilicon layer and over the silicidation inhibitor;
etching the first and second polysilicon layers at the first location to define a first transistor gate structure;
etching the first and second polysilicon layers at the second location to define a second transistor structure;
forming a metal layer in contact with the first transistor structure and the second transistor structure; and
simultaneously converting the second polysilicon layer at the first location and both the first and second polysilicon layers at the second location to silicide, wherein at least a portion of the first polysilicon layer at the first location remains unsilicided.

14. The method of claim 13 further comprising forming the silicidation inhibitor by implanting the first polysilicon layer at the first location with a material selected from the group consisting of hydrogen, carbon, and argon.

15. The method of claim 13 further comprising forming the silicidation inhibitor by implanting the first polysilicon layer at the first location with nitrogen.

16. The method of claim 15 further comprising implanting the nitrogen at the first location to a depth of between about 30% to about 50% of a thickness of the first polysilicon layer.

17. The method of claim 13 further comprising forming the silicidation inhibitor by forming a plasma nitridation layer.

18. The method of claim 13 further comprising:
simultaneously etching both the first and second polysilicon layers at both the first and second locations to define the first and second transistor gate structures;
forming dielectric spacers along first and second sidewalls of both the first and second transistor gate structures; then
performing the act of converting the second polysilicon layer at the first location and both the first and second polysilicon layers at the second location to silicide to form a first transistor gate at the first location and a second transistor gate at the second location.

19. The method of claim 18 further comprising causing the first transistor gate to have a first work function and the second transistor gate to have a second work function which is different than the first work function.

* * * * *

UNITED STATES PATENT AND TRADEMARK OFFICE
CERTIFICATE OF CORRECTION

PATENT NO. : 7,332,388 B2 Page 1 of 1
APPLICATION NO. : 11/076497
DATED : February 19, 2008
INVENTOR(S) : Trivedi et al.

It is certified that error appears in the above-identified patent and that said Letters Patent is hereby corrected as shown below:

In column 9, line 28, in Claim 6, delete "suicide" and insert -- silicide --, therefor.

In column 10, line 24, in Claim 12, delete "ev," and insert -- eV, --, therefor.

Signed and Sealed this

Twenty-seventh Day of May, 2008

JON W. DUDAS
*Director of the United States Patent and Trademark Office*